(12) United States Patent
Wang et al.

(10) Patent No.: US 7,321,492 B2
(45) Date of Patent: Jan. 22, 2008

(54) HEAT SINK MODULE FOR AN ELECTRONIC DEVICE

(75) Inventors: Frank Wang, Taipei (TW); Jui-Chan Fan, Taipei (TW); Chun-Yi Chang, Taipei (TW)

(73) Assignee: Inventec Corporation (TW)

( * ) Notice: Subject to any disclaimer, the term of this patent is extended or adjusted under 35 U.S.C. 154(b) by 296 days.

(21) Appl. No.: 11/058,702

(22) Filed: Feb. 15, 2005

(65) Prior Publication Data

US 2006/0181852 A1    Aug. 17, 2006

(51) Int. Cl.
*H05K 7/20* (2006.01)
*H01L 23/10* (2006.01)
*H01L 23/34* (2006.01)

(52) U.S. Cl. ............... 361/709; 361/704; 361/707; 257/706; 257/707

(58) Field of Classification Search ........ 361/687–689, 361/701–704, 706, 707, 709, 712, 713, 715, 361/720; 257/706, 707, 722, 718, 717; 174/16.3; 165/80.2, 80.3
See application file for complete search history.

(56) References Cited

U.S. PATENT DOCUMENTS

| | | | | |
|---|---|---|---|---|
| 5,884,692 A | * | 3/1999 | Lee et al. | ............... 165/80.3 |
| 5,943,210 A | * | 8/1999 | Lee et al. | ................. 361/697 |
| 6,219,239 B1 | * | 4/2001 | Mellberg et al. | ........... 361/704 |
| 6,282,093 B1 | * | 8/2001 | Goodwin | .................. 361/704 |
| 6,634,890 B2 | * | 10/2003 | Peterson et al. | ............. 439/67 |
| 6,639,800 B1 | * | 10/2003 | Eyman et al. | ............. 361/704 |
| 6,667,874 B2 | * | 12/2003 | Chiang | ...................... 361/213 |
| 6,680,848 B2 | * | 1/2004 | Petit et al. | .................. 361/704 |
| 6,791,838 B1 | * | 9/2004 | Hung et al. | ................ 361/704 |
| 6,809,929 B2 | * | 10/2004 | Liu | ........................... 361/704 |
| 7,187,553 B2 | * | 3/2007 | Schmidberger | ........... 361/719 |
| 2002/0139833 A1 | * | 10/2002 | Armstrong et al. | ...... 228/248.1 |
| 2003/0057548 A1 | * | 3/2003 | Hartke et al. | .............. 257/718 |
| 2004/0047130 A1 | * | 3/2004 | Liu | ............................ 361/704 |
| 2005/0086797 A1 | * | 4/2005 | Popescu | ..................... 29/622 |
| 2005/0103470 A1 | * | 5/2005 | Mathews et al. | .......... 165/80.3 |
| 2005/0231918 A1 | * | 10/2005 | Goldmann | .................. 361/704 |

* cited by examiner

*Primary Examiner*—Lisa Lea-Edmonds
*Assistant Examiner*—Anthony Haughton
(74) *Attorney, Agent, or Firm*—Raymond J. Ho; Venable LLP

(57) ABSTRACT

Disclosed is a heat sink module for an electronic device, comprising a substrate having at least a fixed hole, at least a heat sink fin set disposed on the substrate and having a plurality of heat sink fins and at least a resilient plate disposed on the substrate and having at least a mount hole mounting the substrate on an electronic device component in the electronic device in coordination with the fixed hole so that the substrate can be closely bonded to a surface of the electronic component. Further, since the heat sink fin set is formed on the substrate by punching method, an advantage of low cost of the heat sink module is provided.

10 Claims, 4 Drawing Sheets

HEAT SINK MODULE FOR AN ELECTRONIC DEVICE

BACKGROUND OF THE INVENTION

1. Field of the Invention

The present invention relates to a heat sink module and particularly to a heat sink module for an electronic device.

2. Description of the Related Art

In a current electronic device (e.g. a notebook computer), electronic components (e.g. a chip) therein generally produce a great deal of heat when working under normal states, resulting unavoidably in temperature increases of the electronic components. If the heat produced is not removed appropriately, the electronic component can become exceedingly hot, leading to unstable operations of the electronic component and even stopping the operation of the whole electronic device or causing the electronic device to crash. However, the heat generated through the operation of the electronic component increases continuously as promotion of speeds thereof is achieved constantly. Consequently, heat sink modules suitable for a multitude of electronic devices are unavoidably sought and developed. Referring to FIG. 1A, a conventional heat sink module for a chip is depicted therein. The heat sink module for a chip is a heat sink device 11 threaded onto the chip 12 and having a plurality of heat sink fins, through which heat generated by the chip 12 is conducted out to the ambient air and the purpose of temperature reduction of the chip 12 is naturally achieved. Since the chip 12 has a specific height having a tolerance of height as compared to other chips and the heat sink device 11 can only be disposed at a fixed height, the heat sink device 11 can often not be closely bonded onto a surface of the chip 12, yielding a reduction of heat sinking of the heat sink device 11. Referring to FIG. 1B, another conventional heat sink module for a chip is illustrated therein. The heat sink module for a chip 15 comprises a heat sink device 13 and a resilient plate 14. Through the fixed resilient plate 14, the heat sink device 13 is mounted on the chip 15. Since the resilient plate 14 provides elasticity, the heat sink device 13 can be applied onto chips of different heights and thus the heat sink device 13 can be closely bonded onto a surface of the chip 15. However, since two ends of the resilient plate 14 have to be hooked by a hooking part 17 of a chip connection seat 16 of the chip 15, the chip connection seat 16 used for connection with the heat sink device 13 is required to be specifically designed, greatly reducing convenience of utilization of the heat sink device 13.

The heat sink devices mentioned above are usually manufactured by casting and hence the heat sink fins thereof are each in a form of solid piece body in which more forming materials are required. Further, molds for casting generally have reduced lifetime as compared to those for punching. Hence, the heat sink devices formed by the prior casting method are hard to have low costs.

In view of the above, the heat sink modules for the current electronic devices have the disadvantages of poor fixation to the electronic devices and relative higher manufacturing costs.

SUMMARY OF THE INVENTION

It is, therefore, an object of the present invention to provide a heat sink module for an electronic devices which is easy to be fixed on the electronic device and has a relatively lower manufacturing cost as compared to the prior heat sink devices.

To achieve the above object, the heat sink module for an electronic device according to the present invention comprises a substrate having at least a fixed hole, at least a heat sink fin set disposed on the substrate and having a plurality of heat sink fins and at least a resilient plate disposed on the substrate and having at least an mount hole mounting the substrate on an electronic device component in the electronic device in coordination with the fixed hole so that the substrate can be closely bonded to a surface of the electronic component. Further, since the heat sink fin set are drawn mold into the substrate, an advantage of low cost is provided.

In the heat sink module for an electronic device according to the present invention, tight bonding between the substrate and the electronic device is obtained by the provision of the resilient plate. Further, since the punching method is employed for forming both the substrate and the heat sink fin set, manufacturing cost of the heat sink module is relatively reduced.

The detailed description and implementations of the present invention will be given below in connection with the accompanying drawings.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1A:
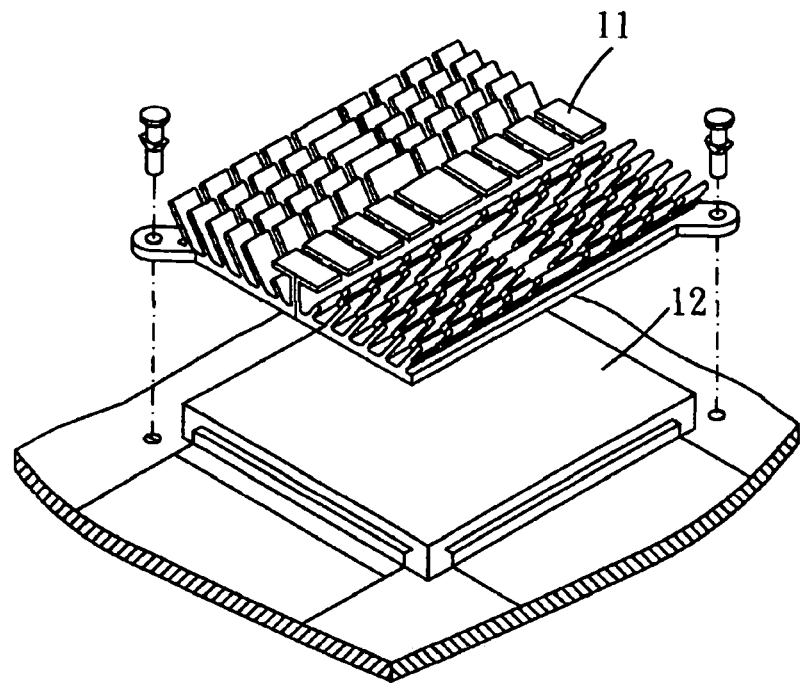
FIG. 1A shows a conventional heat sink module for a chip.
Figure 1B:
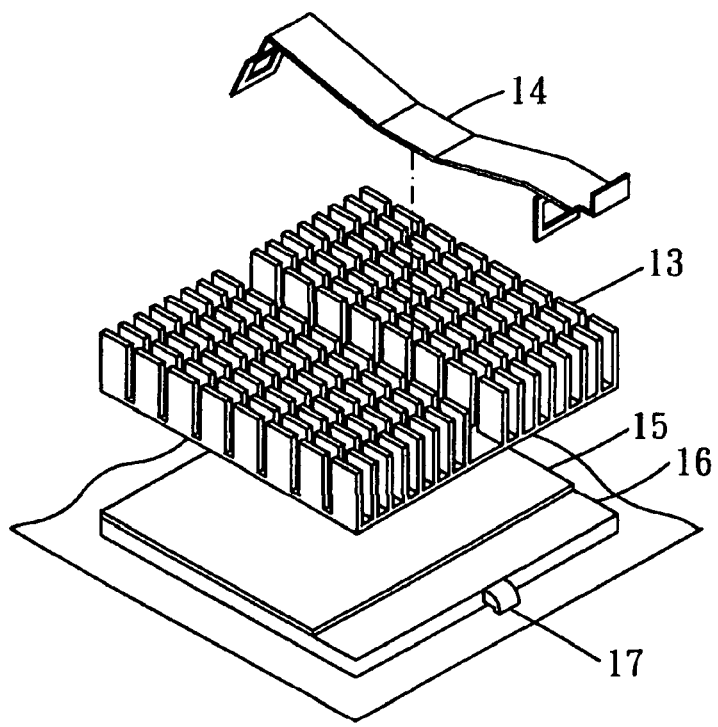
FIG. 1B shows another conventional heat sink module for a chip.
Figure 2:
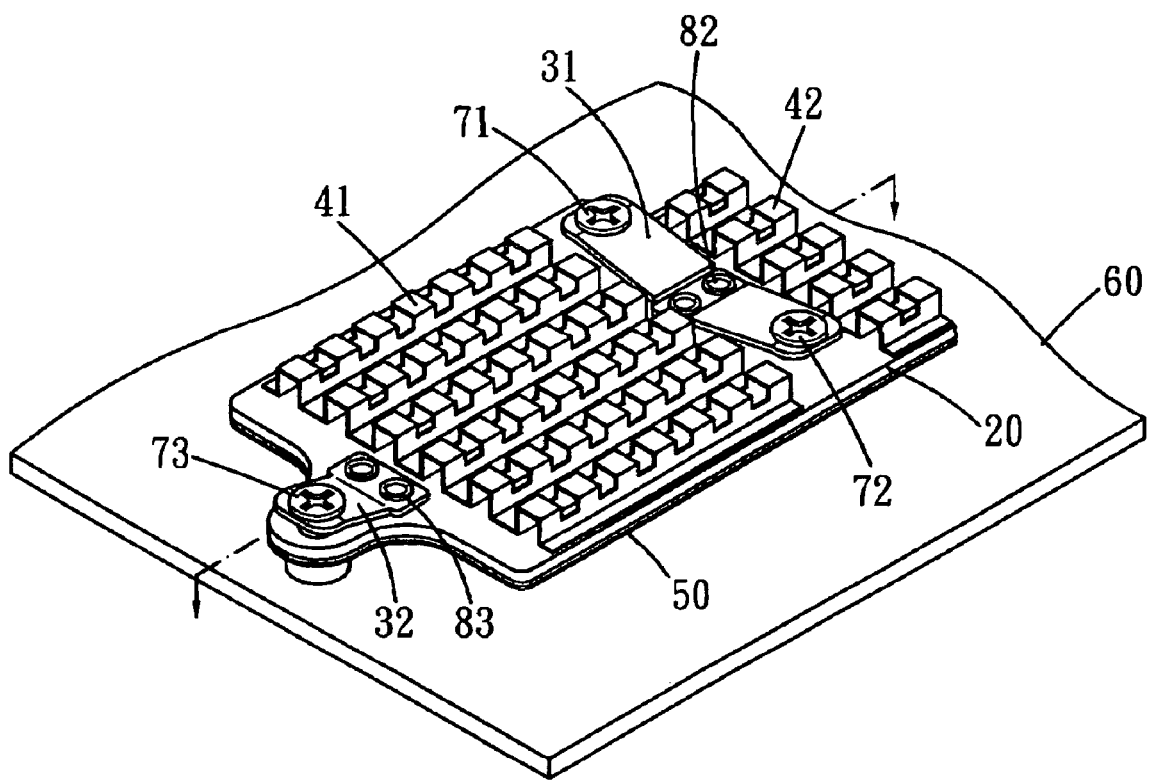
FIG. 2 shows a heat sink module for an electronic device according to an embodiment of the present invention.

Referring to FIG. 2, an embodiment of a heat sink module for an electronic device is shown therein. In this embodiment, the electronic device is a computer chip, e.g. a north-bridge chip. The heat sink module comprises a substrate 20, a first heat sink fin set 41, a second heat sink fin set 42, a first resilient plate 31 and a second resilient plate 32. The first and second heat sink fin sets 41, 42 are welded onto the substrate 20. The first and second resilient plates 31, 32 are fastened by rivets 82, 83 respectively to the substrate 20. When the substrate 20 is screwed to the chip (not shown) by screws 71, 72, 73, heat generated by the chip can be conducted to the first and second heat sink fin sets 41, 42 through the substrate 20 and sent to the ambient air successively through the first and second heat sink fin sets 41, 42, so that temperature of the chip can be efficiently reduced.

Figure 3:
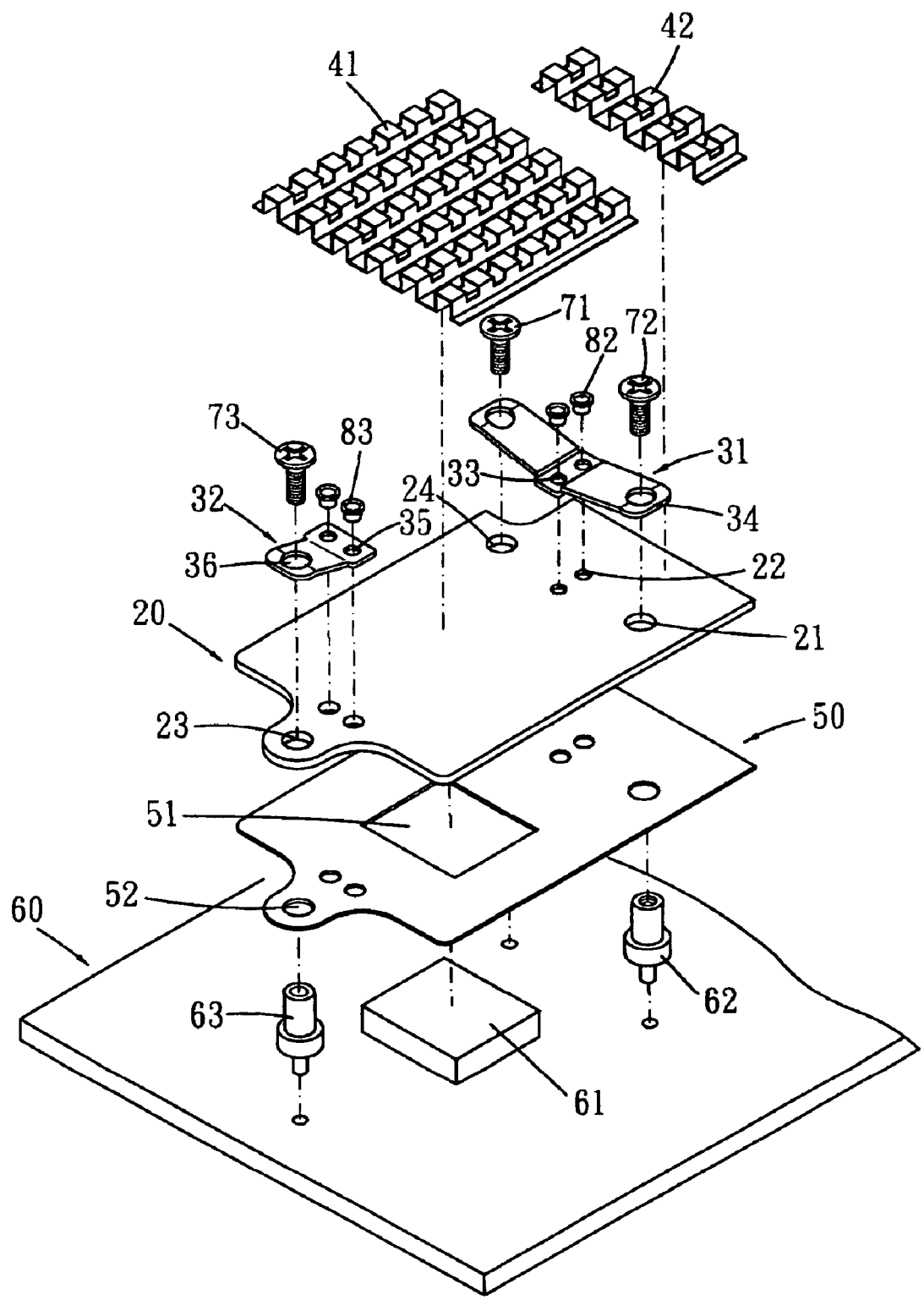
FIG. 3 is an exploded view of the heat sink module as shown in FIG. 2.

Referring to FIG. 3, an exploded view of the embodiment of the heat sink module for an electronic device shown in FIG. 2 is provided therein. As shown, a computer chip 61 is disposed on a printed circuit board (PCB) 60. On the PCB 60, at least a mount seat 62 is disposed. The substrate 20 is formed by punching with respect to a metal having a better heat conductivity (e.g. copper or alumina). The substrate 20 has at least a fixed hole 21 and at least a rivet hole 22. The first heat sink fin set 41 is also formed by punching with respect to a metal of better heat conductivity (e.g. copper or alumina). The first heat sink fin set 41 has a plurality of heat sink fins, which are welded onto the substrate 20, to increase an area of heat sinking and thus efficiency of heat sinking. To further enhance the area and efficiency of heat sinking, a second heat sink fin set 42 is also welded to the substrate 20.

The first resilient plate 31 is made of a metal. In this embodiment, the first resilient plate 31 is provided with at least a rivet hole 33 approximately at its center and a rivet 82 is riveted through the rivet hole 33 and the rivet hole 22 of the substrate 20 to the substrate 20. Alternatively, the first resilient plate 31 may be welded or screwed to the substrate 20. Since the first resilient plate 31 is riveted to the substrate 20, in assembling the first resilient plate 31 to the substrate 20 a mounter only needs to align the mount hole 34 of the first resilient plate 31 to the fixed hole 21 and the screw hole of the mount seat 6 without the need of holding the first resilient plate 31 manually. In this way, efficiency of assembly of the substrate 20 and the first resilient plate 31 is improved. In this embodiment, a second resilient plate 32 is further provided. The second resilient plate 32 is provided with at least a rivet hole 35 at one end and a mount hole 36 at the other end, wherein the mount hole 36 is corresponded to a fixed hole 23 of the substrate 20 in assembly. The fixed holes 21, 23, 24 lay in a triangular arrangement on the substrate 20 so that the substrate 20 may be firmly fixed onto the chip 61.

In this embodiment, an insulating piece 50 is provided between the substrate 20 and the chip 61 to avoid any damage of short circuiting resulted from electrical connection between other electronic devices caused by the substrate 20. In addition, the insulating piece 50 is also provided with a chip hole 51 so that the chip 61 can contact the substrate 20 through the chip hole 51.

Figure 4:
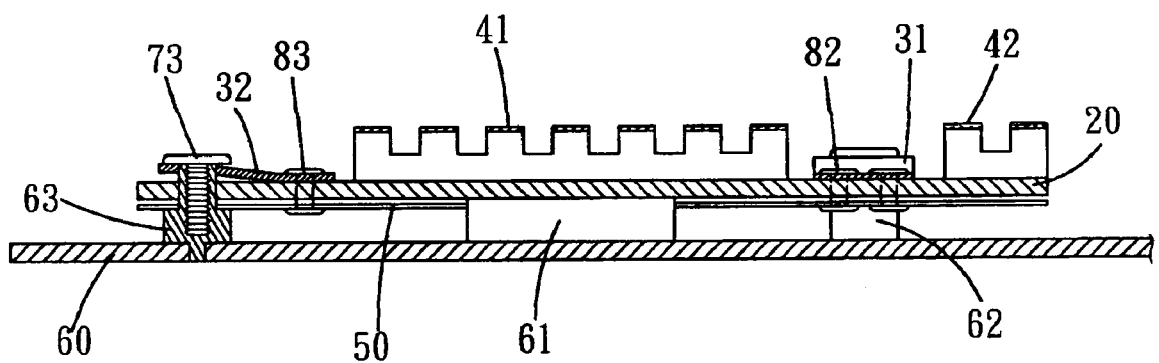
FIG. 4 is a cross-sectional view of the heat sink module as shown in FIG. 2.

A screw 73 can be used to screw the second resilient plate 32 to a mount seat 63 of the PCB 60 through the mount hole 36 of the second resilient plate 32, the fixed hole 23 of the substrate 20 and an open hole 52 of the insulating piece 50. Referring to FIG. 4, a sectional view of the heat sink module for an electronic device shown in FIG. 2 is illustrated therein. With an aid of elasticity provided by the first and second resilient plates 31, 32, the substrate 20 can move vertically within a specific range. Therefore, the heat sink module of the invention can be applied onto chips of different heights and the vertical movement as mentioned above can counterbalance the tolerance caused from the assembly and manufacturing of the heat sink module so that it is ensured that the substrate 20 can be closely bonded to the surface of the chip 61 and better efficiency of heat sinking is achieved.

As compared to the conventional heat sink modules, the substrate 20 of the heat sink module of the present invention can be more closely bonded to the surface of the chip by the use of the resilient plates 31 and 32 and the use of the resilient plates 31 and 32 provides better elasticity. Further, each component of the heat sink module of the invention is not manufactured by casting and the manufacturing cost for the heat sink module is reduced.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A heat sink module for an electronic device used for heat sinking an electronic component in the electronic device, comprising:
    a substrate having at least a fixed hole;
    at least a heat sink fin set disposed on said substrate and having a plurality of heat sink fins; and
    at least a resilient plate disposed on a surface of said substrate, and said heat sink fin set disposed on said surface of said substrate, wherein said resilient plate is a winged structure having two wings oppositely extending from the middle of said winged structure, said resilient plate having at least a mount hole disposed at the end of the wings respectively, and at least a rivet hole disposed at the middle of the winged structure, said resilient plate riveted to said substrate through said rivet hole by a rivet, and said mount holes for mounting said substrate on the electronic component in the electronic device in coordination with said fixed hole, so that said substrate is closely bonded to said electronic component.

2. The heat sink module as claimed in claim 1, wherein said substrate is made of one of copper and alumina.

3. The heat sink module as claimed in claim 1, wherein said substrate is provided with three fixed holes disposed in a triangular arrangement.

4. The heat sink module as claimed in claim 1, wherein said resilient plate is welded to said substrate.

5. The heat sink module as claimed in claim 1, wherein said resilient plate is screwed to said substrate.

6. The heat sink module as claimed in claim 1, wherein said plate is provided with at least a rivet hole approximately at a center thereof and riveted to said substrate through said rivet hole by a rivet.

7. The heat sink module as claimed in claim 1, wherein said heat sink fin set is made of one of copper and alumina.

8. The heat sink module as claimed in claim 1, wherein said heat sink fin set is formed by punching.

9. The heat sink module as claimed in claim 1, wherein said heat sink fin set is welded to said substrate.

10. The heat sink module as claimed in claim 1, further comprising an insulating piece disposed between said substrate and said electronic component.

* * * * *